United States Patent [19]
Tennant et al.

[11] Patent Number: 5,521,031
[45] Date of Patent: May 28, 1996

[54] PATTERN DELINEATING APPARATUS FOR USE IN THE EUV SPECTRUM

[75] Inventors: Donald M. Tennant, Freehold; Donald L. White, Morris Plains; Obert R. Wood, II, Little Silver, all of N.J.

[73] Assignee: AT&T Corp., Murray Hill, N.J.

[21] Appl. No.: 326,449

[22] Filed: Oct. 20, 1994

[51] Int. Cl.$^6$ ........................................ G03F 9/00
[52] U.S. Cl. ..................... 430/5; 430/322; 430/324; 378/34; 378/35
[58] Field of Search ................ 430/5, 322, 324; 378/34, 35, 85

[56] References Cited

U.S. PATENT DOCUMENTS

| | | | |
|---|---|---|---|
| 4,890,309 | 12/1989 | Smith et al. | 378/35 |
| 5,315,629 | 5/1994 | Jewell et al. | 378/34 |
| 5,339,346 | 8/1994 | White | 378/34 |

OTHER PUBLICATIONS

Y.-C. Ku, et al., "Use of a pi-phase shifting x-ray mask to increase the intensity slope at feature edges", *J. Vac. Sci. Technol.* B 6 (1) Jan./Feb. 1988.

J. E. Bjorkholm, et al., "Reduction imaging at 14 nm using multilayer-coated optics: Printing of features smaller than 0.1 μm", *J. Vac. Sci. Technol.* B 8 (6) Nov./Dec. 1990.

D. W. Berreman, et al., "Use of trilevel resists for high-resolution soft-x-ray projection lithography", *Appl. Phys. Lett.* 56(22), p. 2180 May 1990.

A. E. Novembre, et al., "A sub-0.5 μm Bilevel Lithographic Process Using the Deep-UV Electron-Beam Resist P(SI-CMS)", *Polymer Engineering and Science* vol. 29, No. 14, Jul. 1989.

D. M. Tennant, et al., "Defect repair for soft x-ray projection lithography masks", *J. Vac. Sci. Technol.* B 10 (6) Nov./Dec. 1992.

G. N. Taylor, et al., "Silylated positive tone resists for EUV lithography at 14 nm", *Microelectronic Engineering*, vol. 23, p. 279 (Jun. 1994).

G. N. Taylor, et al., "Self-assembly: its use in at-the-surface imaging schemes for microstructure fabrication in resist films", *Microelectronic Engineering* vol. 23, p. 259 (Jun. 1994).

*Primary Examiner*—S. Rosasco
*Attorney, Agent, or Firm*—George S. Indig

[57] ABSTRACT

The operating principle of the attenuated phase mask is incorporated in a reflecting structure for use with extreme ultraviolet radiation. A working projection-reduction system for use with 0.18 μm and smaller features combines the mask with all-reflecting optics.

8 Claims, 2 Drawing Sheets

PATTERN DELINEATING APPARATUS FOR USE IN THE EUV SPECTRUM

TECHNICAL FIELD

Fabrication of Large Scale Integrated circuits and other devices having submicron features entailing projection lithography by use of extreme ultraviolet delineating radiation.

TERMINOLOGY

EUV—"Extreme Ultraviolet" electromagnetic radiation—radiation within the wavelength range of from 50 nm to 3 nm. This wavelength range is sometimes described as "soft x-ray".

Vacuum Ultraviolet—Electromagnetic radiation in the wavelength range of from 150 nm to 50 nm. Radiation in this range is highly absorbed in usual optical materials which are transmissive at longer wavelengths—an absorption, which like that of the EUV, suggests use of reflecting, rather than transmitting, optics.

Proximity X-ray—A lensless, one-to-one (mask-to-image), lithography system in which the information-containing mask is in near-contact with the image plane.

Wavelength—Unless otherwise noted or implicit, reference to wavelength of delineating radiation is as measured in vacuum.

Leaky Phase Mask—A phase mask in which deliberate passage of illuminating radiation through blocking regions destructively interferes with edge-scattered radiation to lessen scatter-blurring of feature edges. The structure is sometimes referred to as an "attenuated phase mask".

Coherency—Reference is made to spatial coherence of delineating radiation in terms of Filling Factor, σ- i.e. by reference to the degree of coherency yielded by a system satisfying the relationship:

$$\sigma = \frac{NA \text{ of condenser}}{NA \text{ of lens}} \quad \text{Eq. (1)}$$

In accordance with the relationship, a 6 value of zero indicates 100% coherency.

DESCRIPTION OF RELATED ART

It is generally agreed that "next generation LSI"—LSI built to design rules of 0.25 μm or smaller, will require delineating radiation of shorter wavelength than that in the presently-used "near ultraviolet" spectrum. Shorter wavelengths in the deep ultraviolet spectrum (DUV), e.g., at wavelength values of 248 nm initially, and eventually of 193 nm, should be satisfactory for design rules of 0.25 μm and, approaching 0.181 μm. Two candidates are being pursued for use with smaller design rules. The first uses accelerated charged particles—electrons or ions. The second uses electromagnetic radiation beyond the DUV. Radiation in the EUV spectrum (λ=50 nm–3 nm) is under study for fabrication of 0.18 μm devices, and is prospectively useful for smaller design rules, e.g., 0.10 μm and smaller.

Proximity x-ray is, at this time, the most advanced short wavelength delineation technique. A typical system operates at a wavelength in the range of from 0.6 to 1.8 nm. Thin membrane, gold or tungsten masks, spaced 20 to 40 μm from the wafer, to avoid mask damage, have yielded pattern images of 0.1 μm and smaller feature size. Diffraction and penumbra blurring at feature boundaries have been successfully addressed. Diffraction effects are inherently minimized by the short wavelength radiation. Resolution, for already-excellent resist materials, may be further improved by use of phase masks. See, Y.-C. Ku, et al., *J. Vac. Sci. Technol. B* 6, 150 (1988). Penumbra blurring is not a problem for synchrotron sources and small size plasma. The proximity system, still widely pursued, has a significant drawback. Masks, necessarily made to the same design rules as the image, are expensive to fabricate and difficult to repair.

Projection systems providing for image reduction permit use of less expensive, larger-featured masks—features perhaps 5 or more times larger than that of the desired image. Unfortunately, proximity x-ray technology is not transferable to projection. The 1.2 nm radiation, desirable for its lowered diffraction, accompanied by acceptable transmissivity in the membrane mask, is unsuited for transmission optics. Required values of refractive index and transmissivity are not available in otherwise suitable materials.

As a consequence, projection systems use reflective, rather than transmission optics. Since conventional single-surface mirrors have inadequate reflectivity, distributed mirrors—"Distributed Bragg Reflectors" (DBRs)—are used. (These are often called "multilayer mirrors" in the EUV literature.) Again, the 1.2 nm proximity printing wavelength range is unacceptable. Required index differences for suitable DBR structures are unavailable at this wavelength. The wavelength range of particular interest for projection is in the EUV spectrum (50 nm –3 nm).

Substrate-supported DBRs and patterned metal layers, serve as reflecting masks. (Chromium layers, commonly used at longer wavelengths in the ultraviolet spectrum, are replaced by gold or germanium layers in the EUV spectrum.) Features as small as 0.05 μm have been printed in PMMA resist layers using delineating radiation of 13.9 nm wavelength. See, J. E. Bjorkholm, et al., *J. Vac. Sci. Technol. B* 8, 1509 (1990).

Another problem arises. While the gap-induced limitation of proximity printing is avoided—while the projection process offers a high resolution aerial image—appropriate resist materials—have not been found. Delineating EUV radiation is absorbed within a very thin surface layer—far too thin a layer to use as a stand-alone etch-barrier. In thicker, single material, resist layers, the underlying major portion is effectively unexposed, resulting in poorly defined profiles, and in unsatisfactory resolution.

The problem is under study. "Use of Trilevel Resist for High Resolution Soft X-Ray Projection Lithography", D. W. Berreman, er al., *Appl. Phys. Lett.*, vol. 56 (22), 28 (1990) describes a tri-level system constituted of a thin layer of photosensitive material, an underlying thin layer of germanium, and, finally, a thick layer of organic material. After developing the surface image, it is transferred to the silicon substrate in an etch step (in which the two underlying layers serve in succession as etch-barriers).

A promising approach uses a different form of "surface active" resist, and a two-part process providing for transfer of a developed surface image into the underlying part of the resist.

The problem is most severe in the EUV spectrum, for wavelengths >10 nm although it is still a concern at longer wavelengths (e.g. at 193 nm).

SUMMARY OF THE INVENTION

The inventive apparatus serves as an alternative, or supplement, to a surface-activated resist to permit projection-reduction lithography with improved image edge definition. Likely to find substantial use in the EUV spectrum, it depends on use of a phase mask, of unique design. The mask improves resolution of the aerial image, with corresponding improvement in the resist image. The responsible operating principle is that of the transmission leaky phase mask of H. Smith, et al. U.S. Pat. No. 4,890,309 issued 1989, but now embodied in a reflecting structure. The same multi-layer mirror used in lens elements may ,serve as substrate. The masking layer depends on partially-transmitting or "leaky" blocking regions, which impose a 180° round-trip phase delay on delineating radiation reflected from these regions (relative to radiation reflected from unmasked regions).

DETAILED DESCRIPTION

Figure 1:
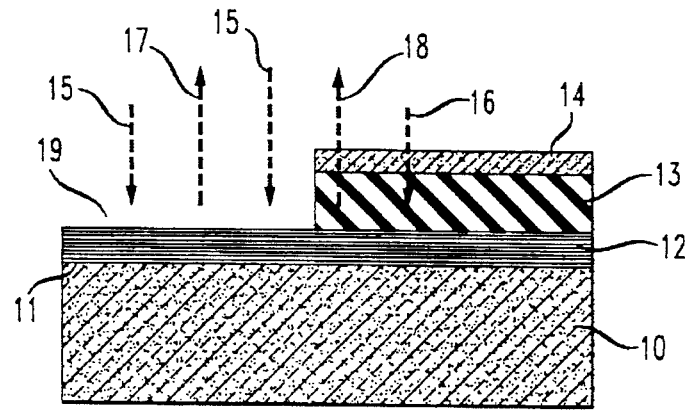
FIG. 1 is a cross-sectional view of a reflective leaky phase mask of the invention. The structure shown uses a bi-layer made up of discrete layers of attenuator and phase shifter, in the blocking regions.

I. General—EUV projection-reduction technology continues to undergo development. The Schwarzschild arrangement, using two spherical mirrors, has been succeeded by ringfield scanning with aspheric corrections. A state-of-the-art apparatus is described in U.S. Pat. No. 5,315,629 issued May 24, 1994. That four-element ringfield scan apparatus is capable of reproducing 0.1 µm features across an arcuate field several mm in width and 30 mm in length.

The commercially accepted form of the invention will depend on many developments. The experimental mask was planar. Incorporation in another element —in a positioning, or even in a non-planar focusing element of the lens train— is a possibility. Elimination of the independent masking element, with accompanying reduced optical losses, may be sufficient compensation for the added complication of building the mask on a curved surface.

Experimental work faithfully reproduced mask lines and spaces in the resist. A degree of freedom is introduced by use of "biased masks"—masks with predistorted features to compensate for distortion introduced by "overexposure".

Use of apparatus incorporating the new mask improves resolution for EUV projection aerial images. Consequential improvement in resist images—10% steeper feature edges—improves resolution in the final device. Still further improvement will result by modifying processing to take advantages of the new mask. Co-filed U.S. Pat. App. 08/326, 444 describes improved processes.

Choice of wavelength range will depend on a number of factors—e.g., on resist capabilities and on mirror reflectivities. Use of radiation of λ=13.9 nm is representative of the wavelength range of 15 nm–3 nm, within the EUV spectrum used in reported work. The preferred multi-layer phase mask operates over a somewhat broader wavelength range within and beyond the entire EUV spectrum of 50 nm–3 nm. Reflection phase masks, if used in the DUV spectrum (300 nm–150 nm) will likely substitute a simple single-surface mirror, perhaps reinforced by a single Bragg pair.

Specific mask design is primarily for the device fabrication which provoked the work leading to the present invention. That structure uses a simple apertured pattern layer directly deposited on the mirror. Variations are contemplated. Masks are likely to use an apertured pattern to avoid unnecessary absorption loss, but additional layers may be added—to fine-tune the phase shift, or to protect the mirror.

The improved aerial image may have other implications. The same increased edge definition that results in steeper resist profiles results in more sharply defined boundaries in direct processing—in resist-less processing in which radiation-induced changes in the device-functional material are used in processing or in operation. There may be other uses.

II. Mask—Claimed masks use the operating principle of the leaky phase mask of U.S. Pat. No. 4,890,309. That patented mask is similar in structure to an ordinary binary transmission mask, with the exception that the opaque ("blocking") regions transmit a fraction of the incident radiation. Transmission in the range of from 5% to 15% has been found suitable for cancellation of scattered radiation from clear regions. Greater transmission, to 25% or more, should be sufficient for most conditions. The "opaque" regions impose a x phase-delay. Since reflecting, the one-way delay is half that value. (Discussion is for simple structures in which there is no phase delay introduced in the clear regions. If, for some reason, this is not true, the phase delay of the blocking regions is adjusted to maintain a x shift, relative to the clear regions.)

The leaky phase mask principle, used in the present invention, is itself, something of a compromise—is not as efficient as other designs. It is, however, simpler to construct and is less restricting of pattern complexity.

Figure 2:
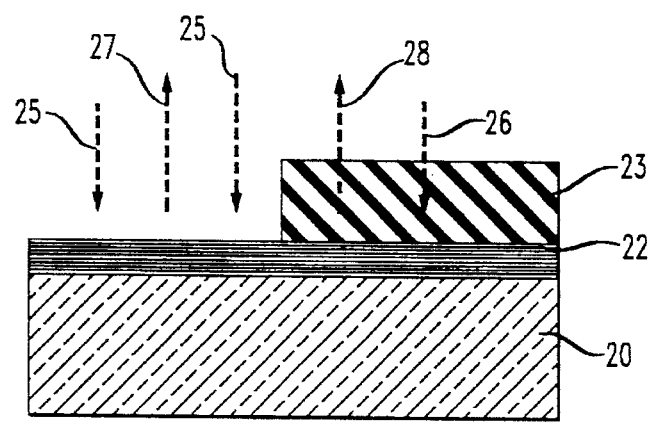
FIG. 2 shows an alternative mask structure of the invention. It is identical to that of FIG. 1, but uses a single layer both for attenuating and phase shifting.

Specific EUV reflective structures are shown in FIGS. 1 and 2. FIG. 1 shows a substrate 10 with a flat surface 11. For temperature stability the substrate is either a low expansion material or a high thermal-conductivity material. A mixed glass composition of 92.6 wt. % $SiO_2$ 7.4 wt. % $TiO_2$ is an example of a suitable low-expansion material. Elemental silicon is an example of a thermally conductive material. The substrate supports a DBR structure 12, of successive layer pairs of high and low refractive index materials. Layer pairs each introduce a phase delay of one or more half wavelengths so that the composite reflection is single-phase. Alternating layers of silicon and molybdenum are suitable in the 13 nm–15 nm wavelength range (40 layer pairs give 60%–63% reflectivity in this range). Molybdenum/beryllium pairs have been used with radiation at λ=11.4 nm. Resist absorption is somewhat less at this wavelength, and reflectivities as high as 68.7% have been reported. (Theoretical reflectivity for Mo/Be DBRs is 80%.) Ruthenium and boron carbide multi-layer mirrors have been used with 6.8 nm radiation. Derailed mirror design may differ from the prototype, constant layer-thickness, structure. Thickness may decrease with distance from the optic axis to compensate for radiation of non-normal incidence.

The blocking (or "opaque") region is a binary layer constituted of phase shifting layer 13 and attenuating layer 14. ("Phase shifting" and "attenuating" describe primary purpose. Taken together, the binary layer introduces the x phase delay with desired attenuation.) Incoming radiation is represented by rays 15 and 16, and reflected radiation by rays 17 and 18. Ray 15, incident on an unmasked portion of the DBR surface 19 is "totally" reflected—i.e., is reflected to the full capability of the DBR. Ray 16, incident on a masked portion of the DBR surface 19, is attenuated and phase shifted during its round-trip passage through layers 14 and 13, and yields ray 18.

The mask of FIG. 2 is identical in operation as that of FIG. 1, but uses a single layer masking region for attenuation and phase shifting. The structure shown is constituted of substrate 20, DBR 22 and blocking layer 23. Layer 23 may be composed of a single component or 2 or more components forming a solid solution or fine mixture. The layer composition, chosen for study, was composed of two components, the first being primarily a phase shifter, and the other primarily an attenuator. An organo-silane may serve for phase-shifting, and an iodine- or bromine-containing molecule may be the absorber. The layer may use a heavy metal for absorption and a phase-shifting lighter metal (with an absorption edge at a wavelength below the operating wavelength). Rays 25, 26, 27 and 28 have the relationship of rays 15, 16, 17 and 18 of FIG. 1. Ray 28 is attenuated and $\pi$ shifted relative to ray 27.

While the larger mask size, permitted by projection, reduces mask cost, repair continues to be a factor. Pin-hole repair is particularly problematic for binary layers. Repair of homogeneous layers—alloy or single material layers—for both shifting and attenuation is simpler. Pin-holes may be plugged, possibly by the method used for deposition of the initial layer. Excess material may be removed by planarization—e.g., by use of an overlying organic layer selected to be etch-eroded at the same rate as that of the masking material.

Figure 5:
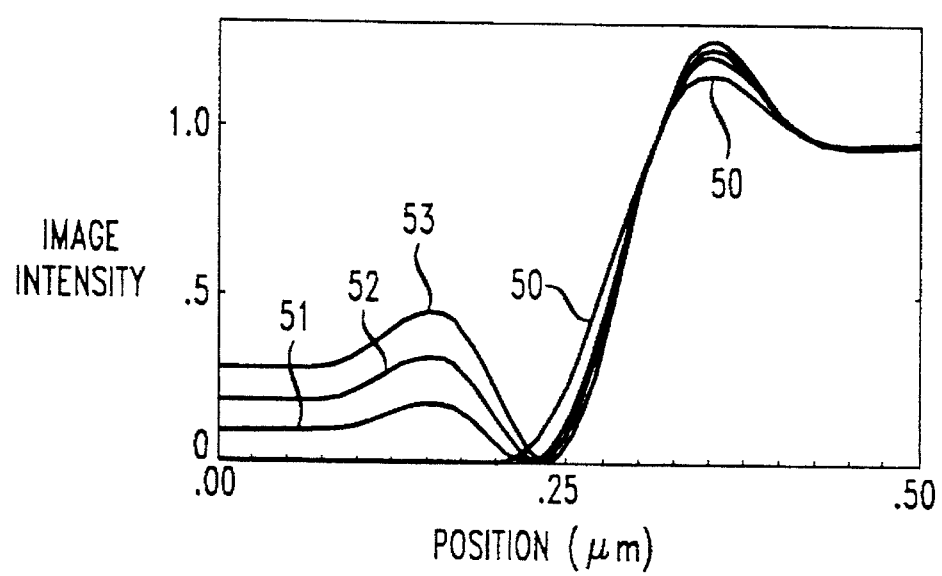
FIG. 5 is a plot relating image intensity to position for aerial images for different values of mask attenuation.

Preference for the transmission range of 5%–15% (2.5%–7.5% for one-way passage) is explained by information plotted in FIG. 5. An illustrative structure used a 0.3 μm bilayer (262 nm bottom layer of PMMA and a 27 nm top layer of germanium). The bilayer was deposited on a 40 pair Mo/Si, ¼λ, DBR, supported by a 0.6 μm silicon substrate.

Mask patterning was by e-beam writing using the Electron Beam Exposure System (EBES), followed by reactive ion etching. Mask fabrication is described by D. M. Tennant, et al., in *J. Vac. Sci. Technol. B.*, vol. 10(6), 3134 (1992).

III. Imaging Resist—The primary objective is to accommodate the highly absorbing nature of resist for the short wavelength radiation. A 1/e attenuation thickness of 0.10–0.15 μm has led to a resist thickness of 60–70 nm. This is too thin a layer to serve as stand-alone protection during etching. A number of innovative resists, designed to solve the problem, have been described, and are likely to be used with the inventive phase mask. They provide for transfer of a thin surface image into the underlying body of the resist layer, often in a separate process step.

The "bilayer" approach uses a discrete surface layer, e.g. of an organometallic, light-sensitive material, and an underlying layer of organic material. A liquid developer has been used to generate an aperture-image in the surface layer. Transfer is by plasma etching. See, A. E. Novembre, et al. "A Sub—0.5 μm Bilevel Lithographic Process Using the Deep-UV Electron-Beam Resist P(SI-CMS)", *Polymer Engineering and Science* vol. 29, no. 14, p. 920 (1989).

In "near-surface" imaging, the thin surface image is developed by chemical crosslinking of the exposed regions, after which uncrosslinked regions are made resistant to plasma transfer, by use of an agent which selectively reacts in these regions. A form of the process uses silylation. See, G. N. Taylor, et al. "Silylated positive tone resists for EUV lithography at 14 nm", *Microelectronic Engineering*, vol. 23, p. 279 (1994).

In "at-the-surface-imaging", refractory films are chemically bonded to organic resist surfaces to provide a plasma resistant etching mask during image transfer. See, G. N. Taylor, et al. "Self-assembly; its use in at-the-surface imaging schemes for microstructure fabrication in resist films", *Microelectronic Engineering*, vol. 23, p. 259 (1994).

IV. Aerial Image—The advance invariably depends on an improved aerial image—an image with better edge resolution (or edge contrast). This is used to advantage in a variety of ways. It may give greater freedom in choice of resist; it may permit increased exposure time; etc. In terms of the motivating problem—resist absorption—it permits substantially increased thickness for the developed image. Here, the improved edge definition permits increased exposure because of lessened feature broadening. This increased thickness facilitates image transfer into underlying masking material and/or results in a more stable masking layer during subsequent processing. This is described as improved "CD" (critical dimension) control.

Figure 3:
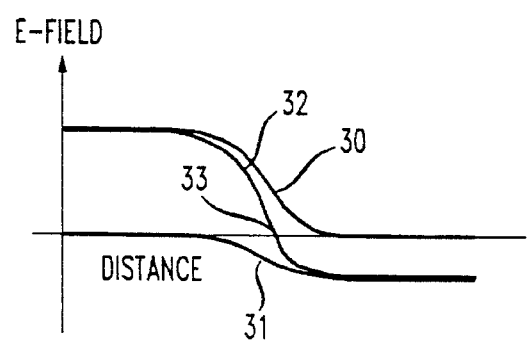
FIG. 3, on coordinates of electric field on the ordinate, and distance on the abscissa, shows the relationship of these quantities for an image produced by a leaky phase mask.

FIG. 3 describes the improvement of the aerial image in terms of electric field amplitude. The FIGURE is plotted on coordinates of E-field and image plane position for a mask portion containing a single feature edge. Three curves are shown. Curve 30 shows the electric field of the radiation reflected from the mask surface. (The form of curve 30 is characteristic of a normal mask made up of nominally totally absorbing and transparent regions.) The field decreases from a maximum value on the unmasked region (left hand region) to zero in the blocking region. Curve 31 shows the field of the fractional portion of radiation reflecting back through the leaky blocking region. Curve 32 shows the resulting composite field—with its total cancellation at feature-edge position 33.

Figure 4:
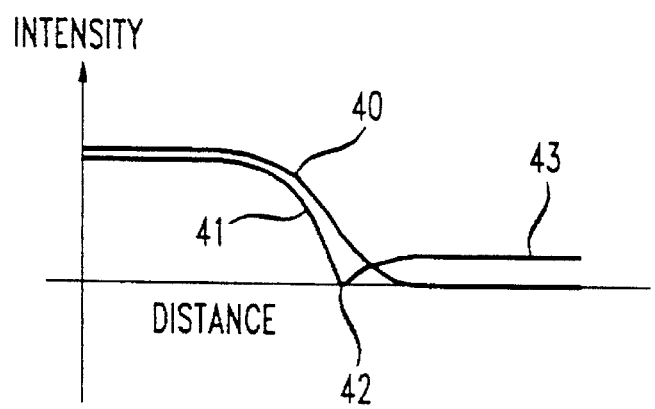
FIG. 4, on coordinates of intensity and distance, shows the intensity variation corresponding with the E-field variation of FIG. 3.

FIG. 4 plots the effect in units of intensity, i.e., the square of the E-field. Curve 40 shows the variation in field intensity in the vicinity of a feature edge for an aerial image produced by a normal mask, monotonically decreasing from its maximum value to zero. Curve 41 shows the intensity distribution for a leaky phase mask. Intensity drops at increasing rate and reaches zero value at feature edge 42, and then changes direction and rises to a finite value. That finite intensity value at the plateau of curve 43, is the "leakage" (or transmission) value that defines the degree of mask attenuation.

FIG. 5 shows an image portion of 0.5 μm width. For the 0.50 μm lines and spaces of the image, This portions shows a single feature edge (in the center of the span), bounded by a half line (left-hand portion) and a half space (right-hand portion). Ordinate units are image intensity.

FIG. 5 shows the aerial image for four values of mask attenuation. That of curve 50 is a normal mask made up of blocking regions of 100% nominal opacity. Curves 51, 52 and 53 show phase masks with varying transmission—curve 51 for 10%, curve 52 for 20%, and curve 53 for 30%. In abscissa units, the feature edge is considered to lie at 0.25. The improvement in slope for each of curves 51, 52 and 53 is evident. While there is some improvement with increased transmission, there is little change beyond the 10% transmission which shows improvement of about 10° in the units of the figure.

The 10% transmission mask is a compromise between image contrast and interference structure. Final choice will depend on resist characteristics; circuit design; and radiation coherency. In general, the preferred transmission range is 5%–20%.

Synchrotron and plasma sources are studied for EUV lithography. The synchrotron is inherently near 100%-coherent. Scatter plates have been used to reduce coherency to the desired range. U.S. Pat. No. 5,439,781, filed May 10, 1993, describes appropriate synchrotron collection optics. Plasma source emission is generally enlarged in use and is effectively incoherent. Collector optics with appropriate filling factors for assuring the desired coherence are described in U.S. Pat. No. 5,339,346, Aug. 16, 1994.

We claim:

1. Lithographic mask comprising a mask pattern for producing a projection image, the projection image including features of least dimension less than 0.25 μm, the mask pattern consisting of transparent regions and blocking regions for selectively transmitting and blocking delineating radiation, the blocking regions being so composed and of such thickness as to transmit a portion of incident delineating radiation, while imposing a phase delay, so that the portion is phase shifted by about 180° relative to that transmitted through transparent regions, whereby feature edge definition is improved by destructive interference,

CHARACTERIZED IN THAT the mask is a reflecting mask including a reflecting substrate with its reflectivity dependent on a multi-layer distributed reflector, and in that blocking regions mask the reflecting substrate from incident radiation, the thickness of the blocking regions being such as to impose a phase shift of about 90° for one-way passage of radiation, in which the thickness and refractive index of the blocking regions is such as to provide this phase shift for radiation of a wavelength within the wavelength range of from 150 nm to 3 nm.

2. Mask of claim 1 in which the composition of blocking regions contains at least two ingredients.

3. Mask of claim 2 in which blocking regions consist of at least two discrete layers of differing composition.

4. Mask of claim 3 in which blocking regions consist essentially of two discrete layers.

5. Mask of claim 2 in which discrete ingredients constitute a physical mixture.

6. Mask of claim 1 in which blocking regions consist essentially of a single layer of homogeneous material.

7. Mask of claim 1 in which blocking layer thickness provides the phase shift for radiation of a wavelength within the wavelength range of 50 nm–3.0 nm.

8. Mask of claim 7 in which image feature dimension is less than 0.18 μm.

* * * * *